United States Patent
Schmitt et al.

(10) Patent No.: US 6,986,955 B2
(45) Date of Patent: Jan. 17, 2006

(54) ELECTRONIC AND OPTICAL MATERIALS

(75) Inventors: Jerome Schmitt, Dawsonville, GA (US); George Guang-Ji Cui, Orange, CT (US); Henry A. Luten, III, Ypsilanti, MI (US); Fang Yang, Atlanta, GA (US); Fe Alma Gladden, Duluth, GA (US); Scott Flanagan, Atlanta, GA (US); Yongdong Jiang, Atlanta, GA (US); Andrew Tye Hunt, Atlanta, GA (US)

(73) Assignee: nGimat Co., Atlanta, GA (US)

( * ) Notice: Subject to any disclaimer, the term of this patent is extended or adjusted under 35 U.S.C. 154(b) by 12 days.

(21) Appl. No.: 10/019,082

(22) PCT Filed: Aug. 2, 2001

(86) PCT No.: PCT/US01/24587

§ 371 (c)(1),
(2), (4) Date: Dec. 26, 2001

(87) PCT Pub. No.: WO02/11980

PCT Pub. Date: Feb. 14, 2002

(65) Prior Publication Data
US 2003/0228500 A1 Dec. 11, 2003

Related U.S. Application Data

(60) Provisional application No. 60/222,876, filed on Aug. 3, 2000.

(51) Int. Cl.
B32B 9/04 (2006.01)
B32B 3/00 (2006.01)
C30B 29/32 (2006.01)
C01G 23/047 (2006.01)

(52) U.S. Cl. .................. 428/697; 428/209; 428/699; 428/701; 428/702; 117/949; 423/594.16; 423/598

(58) Field of Classification Search ............ 428/697, 428/699, 701, 702, 469, 209, 598, 594.16; 117/949
See application file for complete search history.

(56) References Cited

U.S. PATENT DOCUMENTS

| | | | |
|---|---|---|---|
| 5,132,282 A * | 7/1992 | Newman et al. ............ 505/220 |
| 5,572,052 A * | 11/1996 | Kashihara et al. .......... 257/295 |
| 5,612,082 A * | 3/1997 | Azuma et al. ................ 427/96 |
| 5,614,018 A * | 3/1997 | Azuma et al. ................ 117/68 |
| 5,624,707 A * | 4/1997 | Azuma et al. ................ 427/96 |
| 6,376,090 B1 * | 4/2002 | Kijima ........................ 428/469 |

FOREIGN PATENT DOCUMENTS
JP 11031921 A * 2/1999
WO WO 91/14028 * 9/1991

* cited by examiner

Primary Examiner—Stephen Stein
(74) Attorney, Agent, or Firm—Alfred H. Muratori; Wayne E. Nacker

(57) ABSTRACT

Epitaxial and reduced grain boundary materials are deposited on substrates for use in electronic and optical applications. A specific material disclosed is epitaxial barium strontium titanate (14) deposited on the C-plane of sapphire (12).

16 Claims, 1 Drawing Sheet

ELECTRONIC AND OPTICAL MATERIALS

This application is a 371 of PCT/US01/24587 filed Aug. 2, 2001, which claims priority to U.S. Provisional Application 60/222,876 filed Aug. 3, 2000.

The present invention is directed to epitaxial thin films of barium strontium titanate (BST) on sapphire (single crystal alumina) and to electrical (microwave) and non linear optical (or photonic) devices formed thereon.

BACKGROUND OF THE INVENTION

Thin films (and thick films in some cases) are useful for forming many different electronic and optical devices. Capacitors (and other devices such as phase shifters) are formed by depositing dielectric material and conductive material layers, the conductive layer(s) forming the electrodes of the capacitor. In optical devices, films of material having relatively high indexes of refraction are deposited adjacent to films of materials having relatively low indexes of refraction to form wave-guides, filters, lenses and other devices. Many materials are useful for forming both the dielectric material as well as the materials having high indexes of refraction.

Also, in the fields of electronics, RF and photonics, the use of electrically active materials is becoming more and more popular. Electrically active materials are those materials that have a particular parameter that can be changed by applying an electric field through the material. This parameter may be optical such as the index of refraction of the material (electrooptic, E-O, materials), or may be electrical such as the dielectric constant (ferro (or para) electric). As these two parameters are closely associated, many materials are both ferroelectric and electrooptic.

The class of dielectric materials that possess the property that their permittivity (dielectric constant—DK) changes under the application of a DC or slowly varying electric field are commonly referred to as "ferroelectrics" (f-e) if the material is designed to operate below the material's Curie temperature or point, or "paraelectrics" (p-e) if the material is designed to operate above its Curie point. For simplicity, they will be called ferroelectrics (f-e) in this disclosure, and it will be understood to apply to either f-e or p-e materials. Of particular interest for microwave device applications is the paraelectric range of a material, i.e., where the material is above its Curie temperature. In the paraelectric region the variation in capacitance of the material is substantially linear with respect to applied bias voltage. Barium strontium titanate having the formula $Ba_xSr_{1-x}TiO_3$ (BST) is a highly studied material with great potential in these applications. BST is used herein to refer to material having the formula $Ba_xSr_{1-x}TiO_3$ where x equals 0, equals 1, or x is greater than 0 and less than 1. For $SrTiO_3$ (x equals 0) the Curie temperature is very low, and this material is in the paraelectric range at cryogenic temperatures. For $BaTiO_3$ (x equals 1) the Curie temperature is high. Generally an intermediate Curie temperature is desired; thus for most applications, the molar ratio of Ba:Sr is between 10:90 and 90:10, particularly between 30:70 and 70:30, more particularly between 60:40 and 40:60. The choice of Ba:Sr, and thereby the selection of Curie temperature, is thus selected according to the anticipated operating temperature of the device. For devices intended to be operated in a range encompassing room temperature, a Ba:Sr molar ratio of between 60:40 and 40:60 is preferred. Mixed oxides, such as BST where x is greater than 0 and less than 1 are harder to deposit than single cation oxides, such as when x is 0 or 1. This difficulty is primarily compositional control. The combustion chemical vapor deposition process, as described for example, in U.S. Pat. No. 5,652,021, the teachings of which are incorporated herein by reference, allows the use of a single precursor solution containing precursors for all cations. A single solution significantly aids in compositional control, although it is important to maintain other depositional parameters, such as temperature, pressure, gas flow rates, etc. in order to maintain compositional control even in a CCVD process. Preferably, in a mixed BST, the ratio of B/S does not vary spatially more than about 5%, preferably no more than about 1% during the deposition of a layer.

Electrical, radio frequency (RF), or microwave applications of these electrically active materials include such general classifications as varactor diode replacement, capacitors, tunable capacitors, tunable filters, phase shifters, multiplexers (to include duplexers), voltage controlled oscillators, tunable matching networks for power amplifiers (PA's), low noise amplifiers (LNA's), thermoelectric effects including power systems, and general impedance matching networks.

The tunable characteristic of f-e materials can be exploited in the design of components, subsystems and/or systems in mobile communication systems to achieve:
1) new capability and improved electrical (RF or microwave) performance from 300 MHz to ~30 GHz
2) smaller size,
3) lower power consumption,
4) less weight, or any combination of these four items as determined by specific system design requirements.

There are numerous ceramic materials that can be used as f-e thin or thick films. Thin films tend to be used in smaller devices than thick films; thin films are generally deposited to a thickness up to 10 microns, while thick films are typically above 10 microns.

Wireless handsets are characterized by their need for low voltage operation, typically <40 VDC, and ideally <3.0 VDC. It is expected that this voltage will decrease further in future designs. Thus, any f-e tunable device must be able to be designed in such a way as to create appropriate electric fields from a small DC tuning voltage. One way to achieve a suitable geometry is to design variable capacitors consisting of thin films of f-e materials. The small DC tuning voltage also results in reduced power consumption (and heat dissipated) from RF and E-O devices.

Tunable capacitors allow for the f-e material to be localized to a small part and allows for the use of the small geometries needed to create electric fields of sufficient magnitude necessary for tuning from small voltages. For the design of tunable filters and multiplexers in the frequency range of >800 MHz (the cellular band), small valued capacitors are required so that the rf signal is not reduced if the variable capacitor is used in such a way as to shunt a resonant structure for tuning purposes.

As previously described, related to the variation in capacitance of these materials with applied bias voltage is the electrooptic phenomena of variation of refractive index with applied bias voltage. Photonic applications of these materials are in phase modulators and active waveguides that have functions such as switch, split, attenuate, compensate or combine.

Barium Strontium Titanate (BST) is a useful material for the above applications. BST is also used herein to refer to doped material wherein an additional element(s), such as lead, replaces some of (usually less than 15%, and more commonly less than 10%, but even up to 50%) of the Barium or Strontium in the crystal lattice. Alternatively, elements such as tungsten, aluminum, magnesium, calcium and others can be used to modify the properties of the BST by replacing some of the Titanium in the lattice. Such dopants may improve the Q factor of the BST. As Ba and Sr have +2 valences, typical valences also have +2 valences. However, combinations of +3, +3, and/or +1/+5 valence doping ion combinations may be used. Cations of valence other then +2 may be used by themselves in BST with vacancies in the lattice structure. Cesium and Bismuth are such dopants. BST is a recognized ferroelectric and $BaTiO_3$ is a known E-O material for the applications described above. BST can be doped with most metallic elements.

To eliminate grain boundaries that create loss in both optical and electrical devices, epitaxial f-e materials are highly preferred to polycrystalline f-e materials. Heretofore, the most common substrate material for epitaxial BST deposition has been magnesium oxide and lanthanum aluminum oxide, materials which have crystal lattice structures which match that of BST. A significant drawback of both magnesium oxide and lanthanum aluminum oxide is that they are currently available only in very small wafer sizes. Furthermore, these small wafers are very expensive to produce. They also tend to exhibit poor crystallinity and poor surface roughness.

There are implicitly huge benefits to be realized from larger wafers. The semiconductor industry is currently moving toward 12 inch square (30 cm. square) wafer sizes so as to realize lower production costs. Similar cost savings can be implicit with ceramic materials available in a larger size for microelectronic device fabrication.

Currently, C-plane sapphire is available in 100 mm wafers with some suppliers planning to introduce 150 mm wafers soon. This is significantly larger than available wafer sizes for magnesium oxide and lanthanum aluminum oxide.

Sapphire, single crystal alumina, has recognized benefits over both magnesium oxide and lanthanum aluminum oxide in that it can be produced at lower cost, increased wafer size, excellent crystallinity and minimum surface roughness. However, BST is not an obvious crystal lattice match, and, indeed, attempts to date to deposit epitaxial BST on sapphire have not met with success. Other ferroelectric and electrooptic materials of significant importance are $ZnO_x$, P(L)ZT and $LiNbO_3$.

SUMMARY OF THE INVENTION

Herein, epitaxial BST is deposited on the C-plane of sapphire. Though C-plane is not an obvious lattice match, an aspect of this invention is epitaxial deposition of BST on the C-plane, which has proven successful. C-plane sapphire retains advantages described above with respect to magnesium oxide and lanthanum aluminum oxide.

While BST has one of the better variable dielectric values, other variable dielectric materials and electrooptic materials can be used including PLZT (lead lanthanum zirconium titanate) $LiN_6O$, ZnO and PZT (Pb/Zr/Ti oxide) as well as any of the other materials that demonstrate a change in dielectric upon biasing. The actual material used as the active material of the device is not a limiting factor within the scope of this invention. Generally the materials to which the invention is most applicable have perovskite structures. Preferred perovskites according to the invention have a cubic structure. Generally perovskites useful in the invention have the formula $A^{+x}B^{+(6-x)}O_3$ where A and B are cations or mixtures of cations and x=1–3.

DETAILED DESCRIPTION OF CERTAIN PREFERRED EMBODIMENTS

Figure 1:
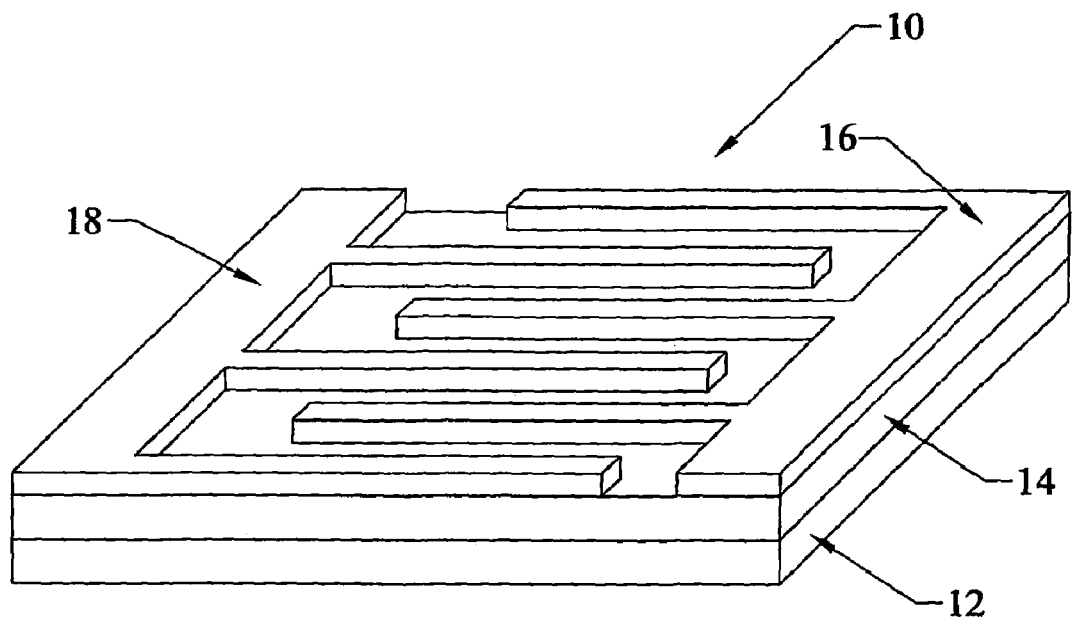
FIG. 1 shows an example of an electronic device incorporating the material of the present invention.

In FIG. 1, an electronic device 10 (such as a capacitor) is shown. A substrate of sapphire 12 is coated with a layer 14 of BST. On top of the BST a conductor (such as copper or gold) is deposited and patterned to form interdigital electrodes 16 and 18. The BST layer acts as a dielectric such that a capacitance is felt across electrodes 16 and 18. With the epitaxial BST of the present invention, a very high dielectric constant is achieved in layer 14, thus a relatively high capacitance is created for a given capacitor architecture. Further, when a DC potential is applied between the electrodes 16 and 18, the dielectric constant is changed within layer 14. This can be used to form voltage tunable filters and other devices as previously described.

Figure 2:
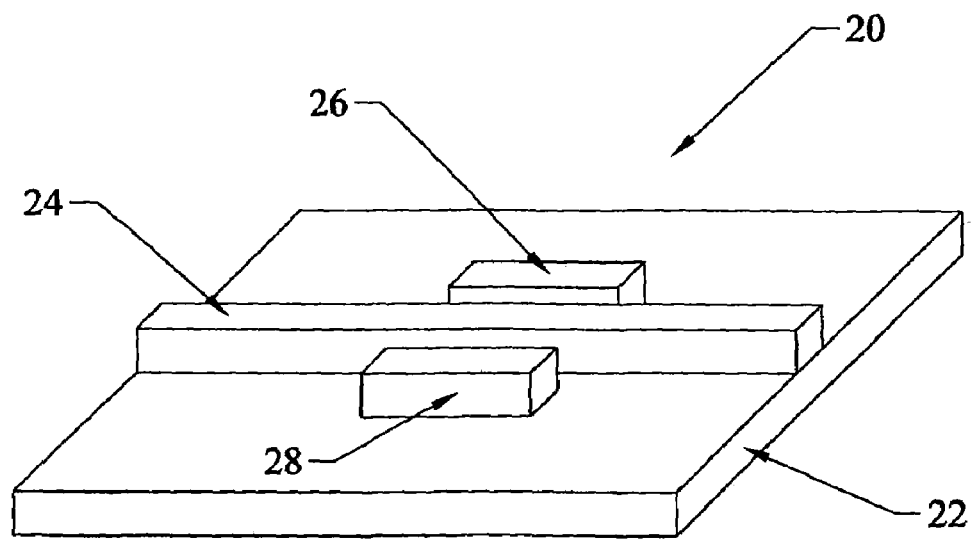
FIG. 2 shows an example of a photonic device incorporating the material of the present invention.

In FIG. 2, a part of a photonic 20 (or optic) device is shown. A substrate of sapphire 22 is coated with a layer of BST, which is the patterned to form waveguide 24. Electrodes 26 and 28 are deposited on either side of the waveguide. By adjusting a DC bias between the electrodes, the refractive index of the BST is changed (electrooptic). This affects the speed of light within the waveguide 24. This can be used to form several types of photonic devices.

As previously described, BST is a particularly useful material for both the ferroelectric and electrooptic thin films of the present invention. Deposition of epitaxial BST on single crystal MgO by CCVD is described in PCT application WO 00/4262 1, the teachings of which are incorporated herein by reference. Epitaxial BST may also be grown by CCVD on c-plane sapphire, as described herein.

The preferred deposition method for epitaxial BST deposition is combustion chemical vapor deposition (CCVD) which is described in U.S. Pat. No. 5,652,021, the teachings of which are incorporated herein by reference. However, it is contemplated that other deposition techniques, such as conventional chemical vapor deposition (CVD), sol-gel and physical vapor deposition (PVD) techniques can be used to deposit epitaxial thin films up to 2000 nanometers thick. Improved deposition techniques may be expected to increase the maximum thickness beyond this thickness. The theoretical minimal thickness for BST films is a molecular monolayer; thus the minimal thickness determined by the molecular size. As a practical matter, to ensure a continuous layer, the thickness of the deposited layer is generally at least about 5 nanometers thick. Currently, most deposits of epitaxial BST are between about 25 and about 1000 nanometers thick.

When BST is deposited by CCVD on c-plane sapphire, deposition is epitaxial, at least in localized regions. Crystalline lattice is substantially 1,1,1.

Some of the Chemical precursors useful in CCVD for deposition of barium, strontium, and titanium are:

---

Ba  barium 2-ethylhexanoate, barium nitrate,
    barium acetylacetonate hydrate,
    bis(2,2,6,6-tetramethyl-3,5-eptanedionato)barium hydrate
Sr  strontium nitrate, strontium 2-ethylhexanoate,
    bis(2,2,6,6-tetramethyl-3,5-heptanedionato)strontium hydrate -continued

| | |
|---|---|
| Ti | titanium (IV) iso-propoxide, titanium (IV) acetylacetonate, titanium (di-iso-propoxide)bis(acetylacetonate), titanium (IV) n-butoxide, titanium (IV) 2-ethylhexoxide, titanium (IV) oxide bis(acetylacetonate) |

Stoichiometry of the mixture of precursor chemicals, i.e., a Ba-containing precursor, a Sr-containing precursor, and a Ti-containing precursor, all mixed together as a solution in an appropriate solvent, e.g., toluene, propane, or a toluene/propane mixture, determines the stoichiometry of the BST that is produced. The stoichiometry of the epitaxial layer which may be produced does not necessarily correspond exactly to the stoichiometry of the precursor solution; however, the stoichiometry of the precursor solution required to deposit a layer of desired stoichiometry in the epitaxial layer may be empirically and predictably determined. Because CCVD is a combustion process that relies on combustion of the precursor chemicals, the oxygen component of BST compounds is implicitly available in the process. If other vapor deposition processes were used, oxygen would have to be supplied.

Characteristics of the BST may be altered by appropriate dopants. Of particularly interest are elements which replace barium, strontium or titanium in the crystal lattice structure. The preferred elements include lead, cesium, tantalum, calcium, tungsten and manganese. Additional elements that may be used include lithium, sodium, potassium, rubidium, magnesium, scandium, yttrium, zirconium, hafnium, vanadium, niobium, chromium, molybdenum, technetium, iron, ruthenium, cobalt, rhodium, iridium, nickel, palladium, copper, silver, zinc, cadmium, mercury, aluminum, gallium, indium, thallium, germanium, tin, antimony, bismuth and iodine.

The ferroelectric effect in BST films is changed by substitution of dopants which replace a minor portion of an ion with an ion or ions different in size to slightly change the lattice structure and/or charge. Such an ion(s) replace between about 0.1 and about 5% of the barium ions. $Cs^+$ is slightly larger than the barium ion and is one such ion that could be used to replace barium. Because Ba has a valence of $+2$ vs. Cs of $+1$, $Cs^+$ can be used in equal molar ratio with a charge balancing ion, $Ba^{+3}$ being a preferred charge-balancing ion.

A general precursor list (that should not be deemed limiting) for depositing elements by CCVD, other than Ba, Sr, and Ti, includes:

| | |
|---|---|
| Ag | silver nitrate, silver trifluoroacetate, silver acetate, silver cyclohexane-butyrate, silver 2-ethylhexanoate |
| Al | aluminum nitrate nonahydrate, aluminum acetylacetonate, triethyl-aluminum, aluminum sec-butoxide, aluminum iso-propoxide, aluminum bis(2-ethylhexanoate)monohydroxide |
| Au | chlorotriethylphosphine gold (I), chlorotriphenylphosphine gold (I) |
| B | trimethylborate, trimethoxyboroxine |
| Bi | bismuth (III) nitrate pentahydrate, bismuth (III) 2-ethylhexonate; Bismuth neodeconate, triphenyl bismuth |
| Cd | cadmium nitrate tetrahydrate, cadmium 2-ethylhexanoate |
| Ce | cerium (III) 2-ethylhexanoate |
| Cr | chromium (III) nitrate nonahydrate, chromium (III) 2-ethylhexanoate, chromium (III) sulfate hydrate, chromium hexacarbonyl, chromium (III) acetylacetonate |
| Cu | copper (II) 2-ethylhexanoate, copper (II) nitrate trihydrate, copper (II) acetylacetonate hydrate |
| Co | cobalt naphthenate, dicobalt octacarbonyl, cobalt (II) nitrate hexahydrate |
| Fe | iron (III) nitrate nonahydrate, iron (III) acetylacetonate |
| In | indium (III) nitrate hydrate, indium (III) acetylacetonate |
| Ir | dihydrogen hexachloroiridate (IV) hydrate, iridium (III) acetylacetonate, dodecacarbonyltetrairidium |
| K | potassium ethoxide, potassium tert-butoxide, 2,2,6,6-tetramethylheptane-3,5-dionato potassium |
| La | lanthanum (III) 2-ethylhexanoate, lanthanum (III) nitrate hexahydrate, lanthanum (III) acetylacetonate hydrate, lanthanum (III) iso-propoxide, tris(2,2,6,6-tetramethyl-3,5-heptanedionato)lanthanum (III) |
| Li | 2,2,6,6-tetramethylheptane-3,5-dionato lithium, lithium ethoxide lithium tert-butoxide |
| Mg | magnesium naphthenate, magnesium 2-ethylhexanoate, bis(2,2,6,6-tetramethyl-3,5-heptanedionato)magnesium dihydrate, magnesium acetylacetonate, magnesium nitrate hexahydrate |
| Mo | ammonium molybdate tetrahydrate, molybdenum hexacarbonyl, molybdenum (IV) dioxide bis(acetylacetonate) |
| Na | 2,2,6,6-tetramethylheptane-3 ,5-dionato sodium, sodium ethoxide, sodium tert-butoxide |
| Nb | niobium (V) ethoxide, tetrakis(2,2,6,6-tetramethyl-3,5-heptanedionato) niobium (IV), niobium (IV) (2-ethylhexanoate) |
| Ni | nickel (II) nitrate hexahydrate, nickel (II) acetylacetonate, nickel (II) 2-ethylhexanoate, nickel (II) napthenate, nickel carbonyl |
| P | triethylphosphate, triethylphosphite, triphenylphosphite |
| Pb | lead (II) 2-ethylhexanoate, lead naphthenate, bis(2,2,6,6-tetramethyl-3,5-heptanedionato)lead (II), lead (II) nitrate |
| Pd | diamminepalladium (II) nitrite, palladium (II) acetylacetonate, ammonium hexochloropalladate (IV) |
| Pt | platinum (II) acetylacetonate, platinum (II) hexafluoroacetylacetonate, diphenyl(1,5-cyclooctadiene)platinum (II), diammineplatinum (II) nitrite, tetraammineplatinum (III) nitrate |
| Ru | ruthenium (III) acetylacetonate |
| Si | tetraethoxysilane, tetramethylsilane, disilicic acid, metasiicic acid |
| Sn | tin (II) chloride dihydrate, tin (II) 2-ethylhexanoate, tetra-n-butyltin, tetramethyltin |
| W | tungsten hexacarbonyl, tungsten (VI) fluoride, tungstic acid |
| Y | yttrium (III) 2-ethylhexanoate, yttrium (III) nitrate hexahydrate, yttrium (III) iso-propoxide, yttrium (III) napthoate |
| Yb | ytterbium (III) nitrate pentahydrate |
| Zn | zinc 2-ethylhexanoate, zinc nitrate hexahydrate, zinc acetate |
| Zr | zirconium (IV) 2-ethylhexanoate, zirconium (IV) n-butoxide, zirconium (IV) hexafluoroacetylacetonate, zirconium (IV) acetylacetonate, zirconium (IV) n-propoxide, zirconium dinitrate oxide |

EXAMPLE

Deposition of BST on Sapphire

In this example, $Ba_{0.6}Sr_{0.4}TiO_3$ coatings were deposited onto C-plane Sapphire 250 nanometers thick using the CCVD process. The solution of the $Ba_{0.6}Sr_{0.4}TiO_3$ precursor contained 0.0143 wt % of Sr in the form of strontium 2-ethylhexanoate, 0.0615 wt % of Ba in the form of barium 2-ethylhexanoate, 0.0355 wt % Ti (di-i-propoxide) bis (acetylacetonate), 12.6049 wt % toluene, 0.0118 wt % isoproponal, 1.5333 wt % 1-butanol, and 85.7412 wt % propane. The constant flow rate for the solution was at 2.0 ml/min and for the tip oxygen 4000 ml/min at 80 psi. The gas temperature as measured close to the substrate front surface varied from 900 to 1100° C. BST deposition was epitaxial with 1,1,1 lattice structure.

What is claimed:

1. A material comprising epitaxial $Ba_xSr_{1-x}TiO_3$ formed as a layer on the C-plane of a sapphire substrate, wherein x has a value from 0 to 1.

2. The material of claim 1 wherein said layer is between about 100 and about 3000 nanometers thick.

3. The material of claim 1 wherein said layer is between about 300 and about 1000 nanometers thick.

4. The material of claim 1 wherein said $Ba_xSr_{1-x}TiO_3$ has a 111 orientation.

5. The material of claim 1 wherein said $Ba_xSr_{1-x}TiO_3$ is doped with an ion or ions that change its properties.

6. The material of claim 5 wherein said doping ions comprise cesium and bismuth.

7. The material of claim 1 further comprising conductive electrodes for applying a bias or RF signal to the $Ba_xSr_{1-x}TiO_3$ layer.

8. A material comprising epitaxial $Ba_xSr_{1-x}TiO_3$ formed as a layer on a sapphire substrate, wherein x has a value from 0.1 to 0.9.

9. The material according to claim 8 wherein x has a value from 0.3 to 0.7.

10. The material according to claim 9 wherein x has a value from 0.4 to 0.6.

11. The material of claim 8 wherein said layer is between about 100 and about 3000 nanometers thick.

12. The material of claim 8 wherein said layer is between about 300 and about 1000 nanometers thick.

13. The material of claim 8 wherein said $Ba_xSr_{1-x}TiO_3$ has a 111 orientation.

14. The material of claim 8 wherein said $Ba_xSr_{1-x}TiO_3$ is doped with an ion or ions that change its properties.

15. The material of claim 14 wherein said doping ions comprise cesium and bismuth.

16. The material of claim 8 further comprising conductive electrodes for applying a bias or RF signal to the $Ba_xSr_{1-x}TiO_3$ layer.

* * * * *